US008222900B2

(12) United States Patent
Wilson et al.

(10) Patent No.: US 8,222,900 B2
(45) Date of Patent: Jul. 17, 2012

(54) ROBUST GRAPPA

(76) Inventors: David L. Wilson, Pepper Pike, OH (US); Donglai Huo, Phoenix, AZ (US)

( * ) Notice: Subject to any disclaimer, the term of this patent is extended or adjusted under 35 U.S.C. 154(b) by 1530 days.

(21) Appl. No.: 11/703,998

(22) Filed: Feb. 8, 2007

(65) Prior Publication Data
US 2007/0219740 A1 Sep. 20, 2007

Related U.S. Application Data

(60) Provisional application No. 60/772,319, filed on Feb. 10, 2006.

(51) Int. Cl.
*G01V 3/00* (2006.01)
(52) U.S. Cl. ......... 324/309; 324/307; 324/310; 324/318
(58) Field of Classification Search .......... 324/300–322; 382/128–131; 600/407–435
See application file for complete search history.

(56) References Cited

U.S. PATENT DOCUMENTS

| | | | | |
|---|---|---|---|---|
| 6,556,009 B2 * | 4/2003 | Kellman et al. | ......... | 324/309 |
| 6,841,998 B1 * | 1/2005 | Griswold | ......... | 324/309 |
| 7,202,663 B2 * | 4/2007 | Huang | ......... | 324/307 |
| 7,348,776 B1 * | 3/2008 | Aksoy et al. | ......... | 324/307 |
| 7,397,242 B2 * | 7/2008 | Samsonov et al. | ......... | 324/309 |
| 7,511,495 B2 * | 3/2009 | Kholmovski et al. | ......... | 324/310 |
| 7,583,082 B1 * | 9/2009 | Hu et al. | ......... | 324/309 |
| 7,592,809 B1 * | 9/2009 | King et al. | ......... | 324/309 |
| 7,622,924 B2 * | 11/2009 | Hwang | ......... | 324/309 |
| 7,671,589 B2 * | 3/2010 | Griswold et al. | ......... | 324/307 |
| 7,777,487 B2 * | 8/2010 | Ying et al. | ......... | 324/309 |
| 7,840,045 B2 * | 11/2010 | Guo et al. | ......... | 382/128 |
| 7,860,291 B2 * | 12/2010 | Hwang | ......... | 382/131 |
| 7,884,604 B2 * | 2/2011 | Kholmovski et al. | ......... | 324/309 |
| 8,026,720 B1 * | 9/2011 | Chen et al. | ......... | 324/309 |
| 8,116,541 B2 * | 2/2012 | Brau et al. | ......... | 382/128 |
| 2002/0097050 A1 * | 7/2002 | Kellman et al. | ......... | 324/309 |
| 2005/0100202 A1 * | 5/2005 | Huang | ......... | 382/128 |
| 2006/0050981 A1 * | 3/2006 | Huang | ......... | 382/254 |
| 2006/0273792 A1 * | 12/2006 | Kholmovski et al. | ......... | 324/309 |
| 2007/0096732 A1 * | 5/2007 | Samsonov et al. | ......... | 324/309 |
| 2007/0219740 A1 * | 9/2007 | Wilson et al. | ......... | 702/85 |
| 2008/0054899 A1 * | 3/2008 | Aksoy et al. | ......... | 324/307 |
| 2008/0175458 A1 * | 7/2008 | Guo et al. | ......... | 382/131 |
| 2008/0197844 A1 * | 8/2008 | Ying et al. | ......... | 324/309 |
| 2008/0279433 A1 * | 11/2008 | Brau et al. | ......... | 382/131 |
| 2008/0309336 A1 * | 12/2008 | Griswold et al. | ......... | 324/309 |
| 2008/0310696 A1 * | 12/2008 | Hwang | ......... | 382/131 |
| 2009/0001984 A1 * | 1/2009 | Hwang | ......... | 324/307 |
| 2009/0224759 A1 * | 9/2009 | Kholmovski et al. | ......... | 324/310 |
| 2009/0285463 A1 * | 11/2009 | Otazo et al. | ......... | 382/131 |
| 2010/0201363 A1 * | 8/2010 | Griswold et al. | ......... | 324/314 |
| 2011/0084693 A1 * | 4/2011 | Kholmovski et al. | ......... | 324/310 |

* cited by examiner

*Primary Examiner* — Melissa Koval
*Assistant Examiner* — Tiffany Fetzner

(57) ABSTRACT

Systems, methods, and other embodiments associated with robust GRAPPA (GeneRalized Auto-calibrating Partially Parallel Acquisitions) are described. One method embodiment includes acquiring k-space data from a magnetic resonance (MR) apparatus having multiple coils and creating a set of over determined linear equations based on auto calibration signal (ACS) lines in the k-space data. The method embodiment includes calculating coil coefficients based on the set of ACS lines and then selectively manipulating a weight associated with an outlying data point to reduce the effect of the outlying data. The method embodiment includes calculating values for missing k-space data points, establishing a full k-space data set, and producing an image from the full k-space data set.

20 Claims, 6 Drawing Sheets

Prior Art Figure 1

ROBUST GRAPPA

CROSS REFERENCE TO RELATED APPLICATIONS

This application claims the benefit of U.S. Provisional application 60/772,319, Titled Robust Grappa, filed Feb. 10, 2006.

FEDERAL FUNDING NOTICE

The invention was made with federal government support under Federal Grant No. 5RO1EB004070 awarded by the NIH. The Federal Government has certain rights in the invention.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise retains all copyright rights whatsoever.

BACKGROUND

Parallel imaging techniques are applied in magnetic resonance imaging (MRI) to improve spatial resolution, temporal sampling, and/or signal to noise ratio (SNR). GRAPPA (GeneRalized Auto-calibrating Partially Parallel Acquisitions) is one parallel imaging reconstruction technique. In GRAPPA, a plurality of ACS (auto calibration signal) lines are acquired in addition to normal down-sampled data. These ACS lines may be used in final reconstruction. However, these ACS lines may also be used for calculating coil coefficients that are used to fill k-space lines that are missing due to partial acquisition.

GRAPPA may employ a least-squares technique to compute the coil coefficients that are used to fill the missing k-space lines. In one example, computing the coil coefficients may include solving over determined equations. Due to the nature of the over determined equations, both estimation accuracy and reconstructed image quality may be negatively affected by outliers in the acquired data.

Conventional GRAPPA may be applied to data acquired using for example, Cartesian sampling trajectories. The acquired k-space data may include two portions: ACS lines from the center region of k-space, and under-sampled outer k-space data. The ACS lines are sampled at the Nyquist rate. However, the under-sampled outer k-space data may be sampled at a lower rate described by reducing the Nyquist rate by an amount referred to as the outer reduction factor (ORF). Additionally, k-space signals may be acquired at a first sampling density in the read direction and at a second more sparse sampling rate in the phase encoding (PE) direction. Additional ACS lines may be acquired near the center of k-space to facilitate calculating coil coefficients.

Prior Art FIG. 1 illustrates one example reconstruction method 100 that includes two logical portions and that performs GRAPPA. A first portion (120-130) follows k-space data acquisition at 110. The k-space data may include both ACS lines and sub-sampled outer k-space data. Method 100 includes, at 120, includes creating over determined linear equations based, at least in part, the ACS lines acquired at 110. Coil coefficients are then estimated at 130 by solving the equations using, for example, a least-squares fit. Blocks of signals from one and/or multiple coils may be used to fit a single ACS line in one coil. A block may include one line of measured signal and (ORF−1) lines of missing signal.

In one example, the least squares fit process may be described by linear equations having the form:

$$S_j^{ACS}(k_y + m\Delta k_y) = \sum_{l=1}^{L}\sum_{b=1}^{4} n_{j,h,l}^m S_l(k_y + bORF\Delta k_y) \quad \text{Equation 1}$$

where j is the index of the target coil (j=1, 2, ... L), l is the index of the L coils, b is the index of the block (b=1-4), n refers to the coil coefficients, and S refers to the measured signals. The coil coefficients n may be obtained using a pseudo-inverse matrix operation. Equation (1) may be applied to each of the L target coils.

A second portion of the prior art method 100 includes, at 140, determining the missing k-space data in outer k-space. This may be achieved by applying equation (1) at different k-space locations using the coil coefficients established at 130 and the sub-sampled k-space data acquired at 110. The missing k-space lines can be reconstructed from this data using direct matrix multiplication. The final full k-space data are created at 150 by combining the k-space data estimated at 140 and the actual k-space data acquired at 110. An image can then be computed at 160 from the final full k-space data created at 150 using conventional techniques. Thus it can be seen that GRAPPA considers every data point equally, which may not be necessary, may lead to artifacts, and may unnecessarily increase processing time.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that unless otherwise stated one element may be designed as multiple elements, multiple elements may be designed as one element, an element shown as an internal component of another element may be implemented as an external component and vice versa, and so on. Furthermore, elements may not be drawn to scale.

Prior Art

DETAILED DESCRIPTION

Figure 1:
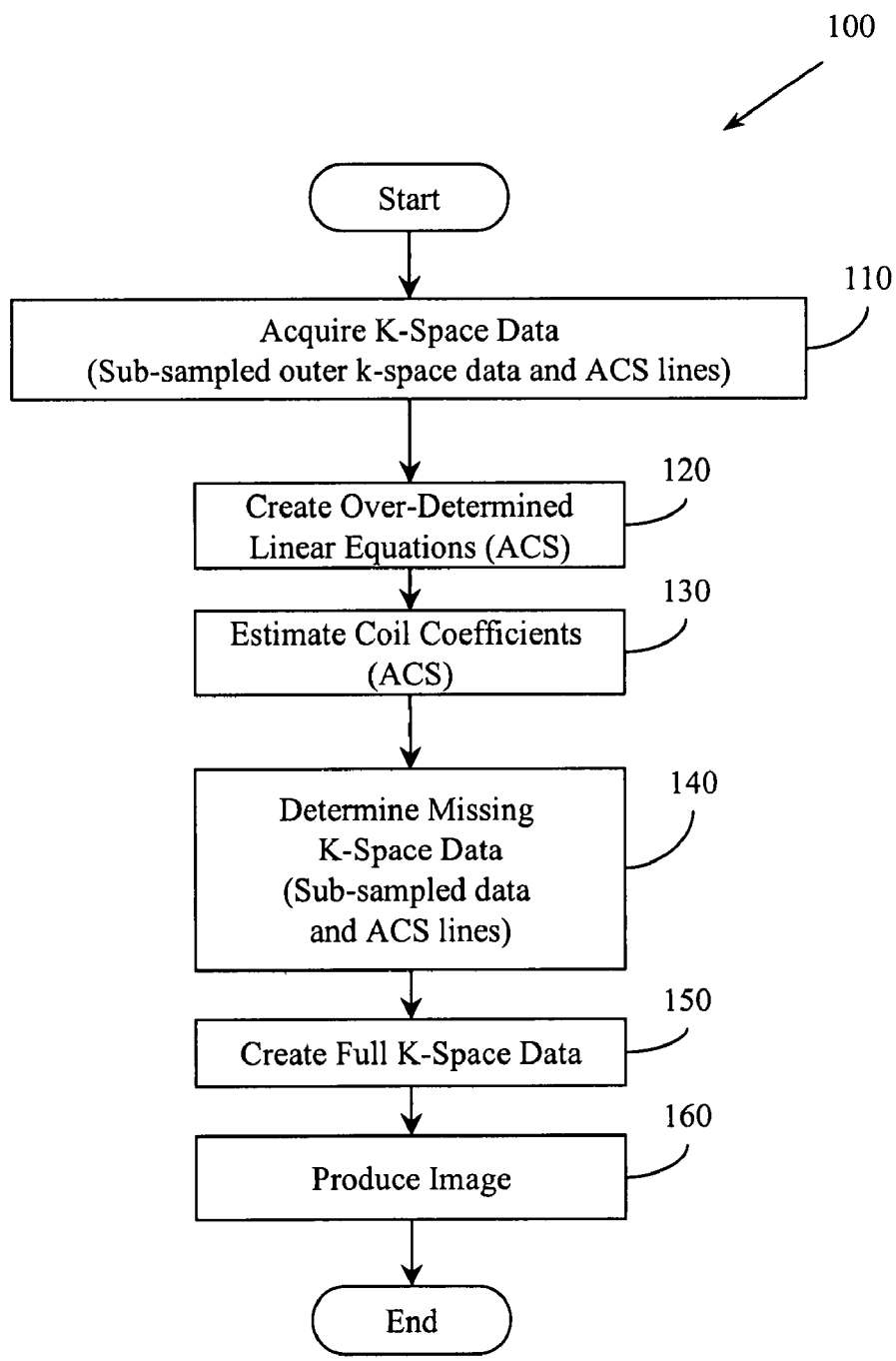
FIG. 1 illustrates a conventional reconstruction method that performs GRAPPA.

Example systems and methods concern improvements to conventional GRAPPA processing. The improved GRAPPA systems and methods may be referred to as "robust GRAPPA". In robust GRAPPA, k-space data points are weighted before reconstruction. In different examples, small and/or zero weights may be assigned to "outliers" in k-space to reduce and/or eliminate their effect on image quality. A first robust GRAPPA ($RG_S$) iteratively re-weights k-space data. A second robust GRAPPA ($RG_F$) eliminates a percentage of k-space outliers by assigning zero weights after an initial estimation procedure and then performs limited recalculations (e.g., two least squares fits). Both $RG_S$ and $RG_F$ improve reconstructed image quality over GRAPPA. Furthermore, $RG_F$ adds little computation time. Thus, in one example, the improved GRAPPA systems and methods identify outlying data, manipulate weights associated with the outlying data to reduce or eliminate its effects, and then recalculate coil coefficients. While positive and zero weights are described, it is to be appreciated that in some examples negative weights, non-zero weights, and/or complex weights could be employed.

Robust GRAPPA may be used in parallel imaging, which is applied in clinical magnetic resonance (MR) acquisition to improve spatial resolution, temporal sampling, and/or SNR. K-space data are acquired simultaneously from multi-channels of a scanner and are used to reconstruct an image. In parallel imaging, acquiring only a fraction of the k-space lines may speed up data acquisition. This may be referred to as partial acquisition. With advanced parallel imaging reconstruction techniques (e.g., SENSE, SMASH), substantially alias-free images can be reconstructed from incomplete k-space data associated with partial acquisition.

SENSE (SENSitivity Encoding) and SMASH (Simultaneous Acquisition of Spatial Harmonics) are parallel imaging reconstruction techniques that reconstruct in image and frequency domains respectively. Both SENSE and SMASH reconstruction methods include coil sensitivity profile estimating. Coil sensitivity information may be acquired by pre-scanning a subject with a fast MR sequence. However, this increases acquisition time. Furthermore, if the subject moves between the calibration scan and the actual acquisition, reconstruction artifacts may be observed. Auto-calibration techniques (e.g., GRAPPA) address this issue by acquiring additional k-space lines and using these lines to extract coil sensitivity information.

GRAPPA is a SMASH-type reconstruction technique that reconstructs data in the frequency domain. GRAPPA first calculates coil coefficients. The coil coefficients store coil sensitivity information and reflect the relevance of a signal(s) from a coil. The coil coefficients store this sensitivity information by fitting the known k-space data into the acquired ACS (Auto Calibration Signal) lines. GRAPPA then calculates the coil coefficients by solving linear equations constructed from the ACS lines. In one example, GRAPPA uses standard least-squares fits to compute the coil coefficients. GRAPPA then uses these coil coefficients to reconstruct missing k-space lines.

Figure 2:
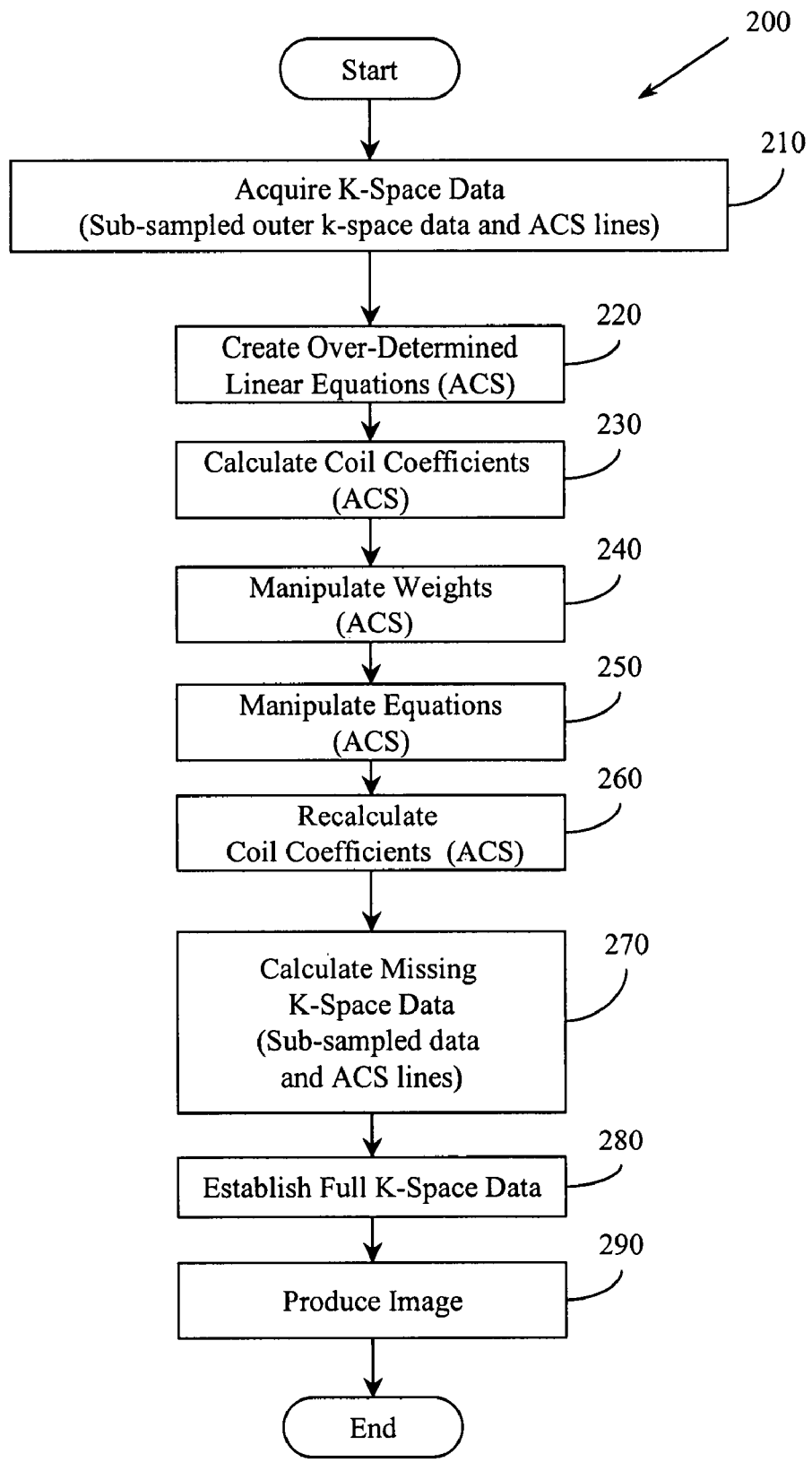
FIG. 2 illustrates a robust GRAPPA method.

As an improvement over GRAPPA, robust GRAPPA includes manipulating coil coefficients using estimation techniques that discount data outliers in coil coefficient estimation. FIG. 2 illustrates one example method 200 that includes a robust GRAPPA section. Method 200 may include, at 210, acquiring a k-space data from a magnetic resonance (MR) apparatus having multiple coils. The k-space data may include both a set of auto-calibration signal (ACS) lines and a set of under sampled outer k-space data. In one example, the set of ACS lines are sampled at the Nyquist rate and the set of under sampled outer k-space data are sampled at a rate less than the Nyquist rate. The lesser rate may be characterized by an outer reduction factor (ORF). In different examples the k-space data may be acquired using different trajectories. For example, a Cartesian trajectory, a radial trajectory, a spiral trajectory, and so on, may be employed. In one example, the k-space data may be acquired from a dynamic MR imaging apparatus.

Method 200 may also include, at 220, creating a set of over determined linear equations. These equations can be used to solve for coil coefficients associated with the coil sensitivity for the coils. The form and content of the over determined linear equations will depend on the data in the set of ACS lines.

Method 200 may also include, at 230, calculating a set of coil coefficients. These coefficients will be calculated using the over-determined linear equations and thus will depend, at least in part, on the data in the set of ACS lines. In one example, the set of coil coefficients are calculated using a least-squares fit to solve the set of over determined linear equations.

Method 200 may also include, at 240, selectively manipulating a weight associated with an outlying data point. Whether a weight is manipulated may depend on whether the point with which the weight is associated is determined to be an outlier. Different approaches including relativistic comparisons and threshold based comparisons can determine whether a data point is an outlier. How a weight is manipulated may depend on whether an $RG_S$ or an $RG_F$ approach is being taken. An $RG_S$ approach is described in connection with FIG. 3 and an $RG_F$ approach is described in connection with FIG. 4.

Method 200 may also include, at 250, selectively manipulating the set of over determined linear equations. How the equations are manipulated may depend on the set of coil coefficients and the new weights.

Method 200 may also include, at 260, recalculating the set of coil coefficients. How the coil coefficients are recalculated may depend, at least in part, on the set of ACS lines and the set of over determined linear equations. In one example, the set of coil coefficients may be recalculated using one or more least-squares fits to solve the over determined equations after the over determined equations have been manipulated. In $RG_S$ the coil coefficients may be iteratively recalculated while in $RG_F$ the coil coefficients may be recalculated a finite (e.g., two) number of times.

Thus, in one example, (e.g., $RG_S$) method 200 may include repetitively performing the following actions: manipulating a weight; manipulating the set of over determined linear equations; and recalculating the set of coil coefficients. The repetition may continue until either a pre-determined number of iterations has occurred or a weight change stability threshold has been satisfied. This stability threshold may describe, for example, the number of weights that are changing and/or the amount by which they are changing. Selectively manipulating a weight associated with an outlying data point includes setting a weight to a value that reduces the significance of the outlying data point. The value may be, for example, a positive real number less than 1.0, a negative value, a complex value, and so on.

In another example, (e.g., $RG_F$) recalculating the set of coil coefficients includes performing a single pass of a least-squares fit. In this example, selectively manipulating a weight associated with an outlying data point includes setting a weight to zero. In either example, the number of outlying data points for which weights will be manipulated may be controlled by a best cut ratio. The best cut ratio may be a user configurable parameter. In one example, the best cut ratio is in the range 5% to 10%. In one example the best cut ratio may describe that 8% of the data values are to be deemed to be outliers and that the 8% are to be identified based on their difference from a norm.

Method 200 may also include, at 270, calculating a value for a missing k-space data point. This value may be calculated using both the sub-sampled data, the ACS lines, and the equations, coil coefficients, and weights manipulated from 220 through 260.

Method 200 may also include, at 280, establishing a full k-space data set. The full k-space data set may be created using both the MR data acquired at 210 and values for missing k-space data points calculated at 270. Method 200 may also include, at 290, producing an image from the full k-space data set.

While FIG. 2 illustrates various actions occurring in serial, it is to be appreciated that various actions illustrated in FIG. 2 could occur substantially in parallel. By way of illustration, a first process could acquire k-space data, a second process could process the over-determined linear equations, a third process could process the coil coefficients, a fourth process could process the weights, and a fifth process could calculate missing k-space data. While five processes are described, it is to be appreciated that a greater and/or lesser number of processes could be employed and that lightweight processes, regular processes, threads, and other approaches could be employed.

In one example, a method is implemented as processor executable instructions and/or operations stored on a computer-readable medium. Thus, in one example, a computer-readable medium may store processor executable instructions operable to perform method 200. While method 200 is mentioned, it is to be appreciated that a computer-readable medium may also store processor-executable instructions operable to perform methods 300 and 400.

Figure 3:
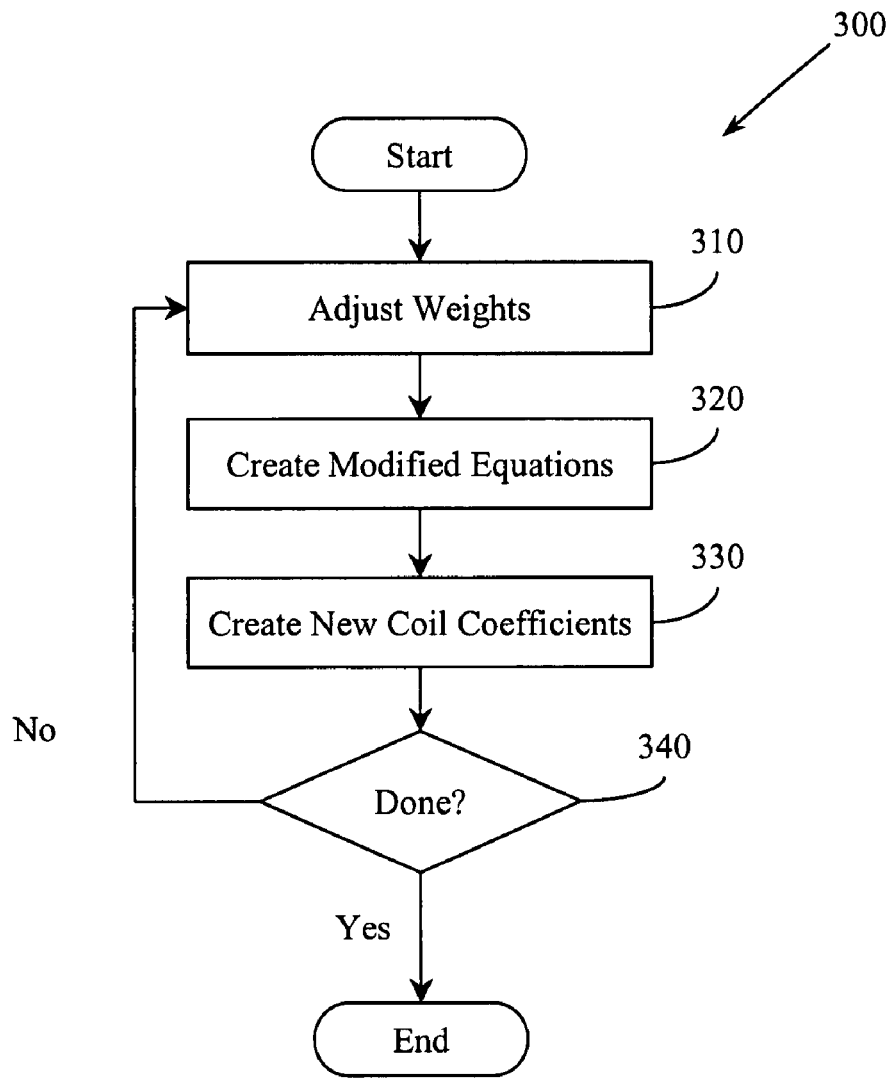
FIG. 3 illustrates a portion of a robust GRAPPA method ($RG_S$).

FIG. 3 illustrates a portion 300 of one example robust GRAPPA method ($RG_S$). In $RG_S$, the pseudo-inverse associated with Equation 1 is replaced by a fitting process that reduces the effect of outlying data. The fitting process includes assigning initial weights and then, at 310 adjusting weights in the estimation equation (e.g., equation 1). With data weights added, we see equation 1 becomes:

$$S_j^{ACS}(k_y + m\Delta k_y) = \sum_{l=1}^{L} \sum_{b=1}^{4} W_j n_{j,h,l}^m S_l(k_y + b(ORF)\Delta k_y) \quad \text{Equation 2}$$

The adjusted weights assigned to each data point in the ACS region adjust the effect of the point on the coil coefficients. Adjusting the weights in $RG_S$ includes using an iteratively re-weighted least squares algorithm. In one example, the weights at each iteration are calculated by applying a bisquare function to the residuals from the previous iteration. Thus, the residuals of the fitting are calculated after the fitting, and the weights for the next iteration are determined using, for example:

$W = (1-r^2)^2$ when abs$(r) < 1$, $W = -(1-r^2)^2$ when abs$(r) \geq 1$, where r=a value computed from the residuals, the median absolute deviation of the residuals from their median, and a leverage value from the least square fit. Having adjusted the weights at 310, new equations can be formed at 320. These equations can then be used to estimate new coil coefficients at 330. At 340, a determination is made concerning whether to continue iterating through adjusting weights 310, creating modified equations 320, and estimating new coil coefficients 330. For example, the process may iterate until either a weight stability threshold is met or until a maximum number of iterations (e.g., 500) is reached. In one example, r=R divided by $C_1$ multiplied by (MAD/$C_2$) times the square root of (one minus h), R being the residuals, $C_1$ and $C_2$ being constants, MAD being the median absolute deviation of the residuals from their median, and h being the leverage from the least square fit. In one example, the first constant may be 4.685 and the second constant may be 0.6745. By using these values and this approach, outliers are given less weight in the final estimation and fitting accuracy is improved.

Figure 4:
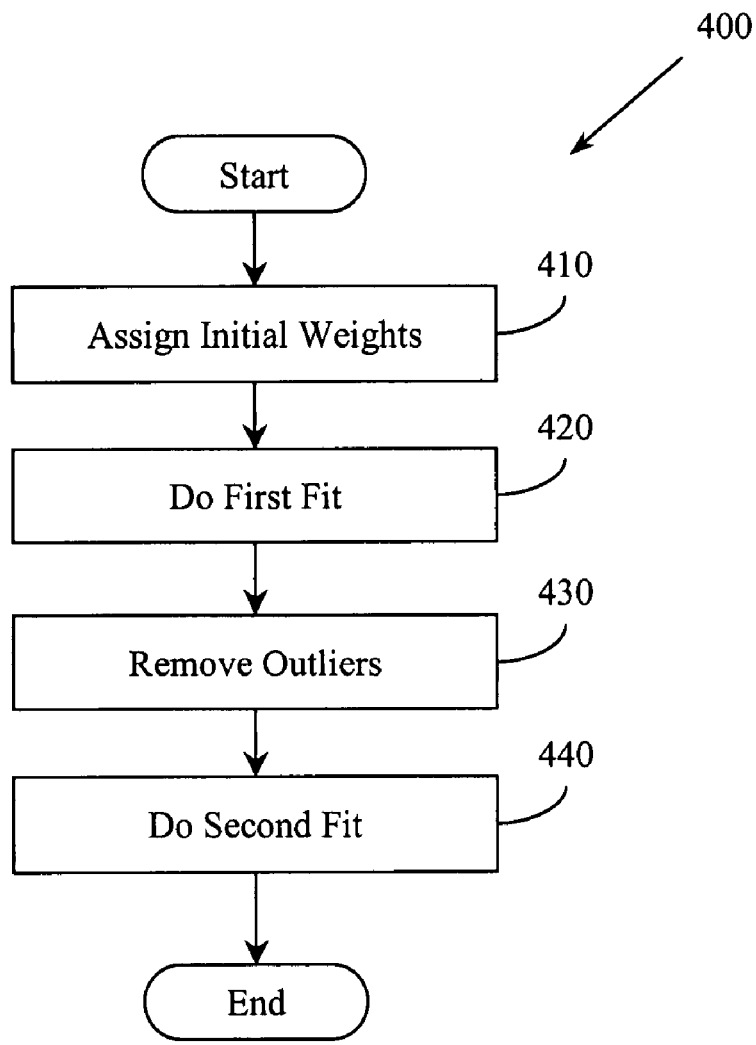
FIG. 4 illustrates a portion of a robust GRAPPA method ($RG_F$).

FIG. 4 illustrates a portion 400 of another robust GRAPPA ($RG_F$) method. In $RG_F$, weights of a certain percentage of outlying data points will be reset to zero. In $RG_F$, outliers are identified and effectively removed from consideration. At 410, initial data weights are assigned. At 420, a first least-squares fit is performed and then residuals are calculated. The largest residuals corresponding to "outliers" will be removed at 430 by setting their weights to zero. An outlier ratio n can control the percentage of residuals that are characterized as outliers and thus eliminated. In one example, n may be user configurable. At 430, the outliers are effectively removed by setting their weights to zero and another least squares fit is performed at 440 to produce the final coil coefficients. In this example, only two least square fits are performed. This reduces computation time while improving final coil coefficients as compared to original GRAPPA. While two least squares fits are described, it is to be appreciated that a different number of least squares fits may be employed.

Robust GRAPPA image reconstruction may be employed in dynamic imaging. In dynamic robust GRAPPA, coil sensitivity information is acquired from a first time frame by acquiring additional ACS lines. This coil sensitivity information, or the coil coefficients, can then be used with subsequent frames. Additionally, while the above examples describe robust GRAPPA in the context of Cartesian sampling, it is to be appreciated that robust GRAPPA may be applied to other sampling techniques including, for example, spiral sampling, radial sampling, and so on.

Figure 5:
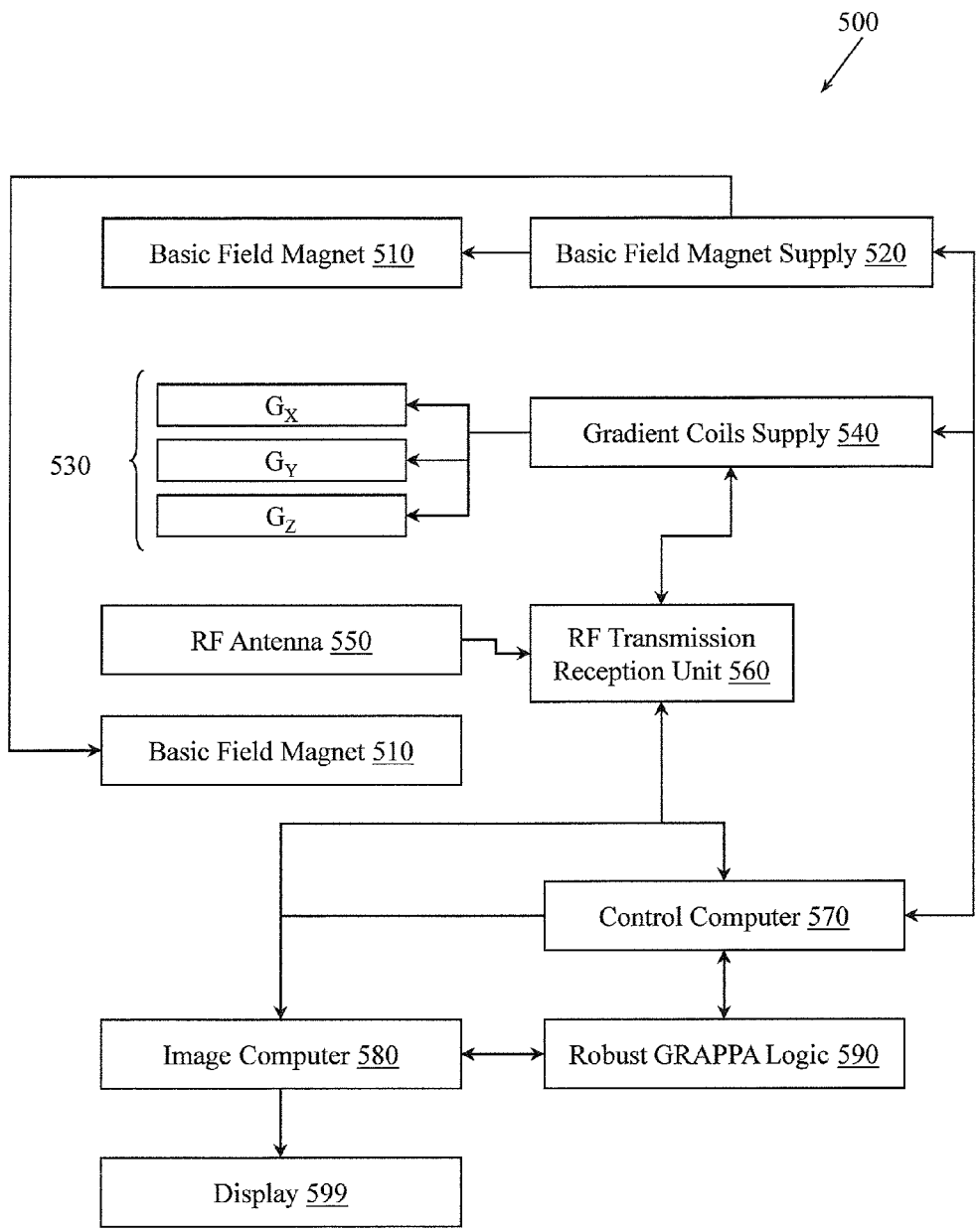
FIG. 5 illustrates an MR apparatus configured with a robust GRAPPA logic.

FIG. 5 illustrates an example MRI apparatus 500 that includes a robust GRAPPA logic 590. The apparatus 500 includes a basic field magnet(s) 510 and a basic field magnet supply 520. Ideally, the basic field magnets 510 would produce a uniform $B_0$ field. However, in practice, the $B_0$ field may not be uniform, and may vary over an object being imaged by the MRI apparatus 500. MRI apparatus 500 may include gradient coils 530 configured to emit gradient magnetic fields like $G_S$, $G_P$ and $G_R$. The gradient coils 530 may be controlled, at least in part, by a gradient coils supply 540.

MRI apparatus 500 may also include an RF antenna 550 that is configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. In one example, separate RF transmission and reception coils can be employed. The RF antenna 550 may be controlled, at least in part, by an RF transmission-reception unit 560. The gradient coils supply 540 and the RF transmission-reception unit 560 may be controlled, at least in part, by a control computer 570. In one example, the control computer 570 may be programmed to perform methods like those described herein.

The magnetic resonance signals received from the RF antenna 550 can be employed to generate an image, and thus may be subject to a transformation process like a two dimensional FFT that generates pixilated image data. The transformation can be performed by an image computer 580 or other similar processing device. The image data may then be shown on a display 599.

While FIG. 5 illustrates an example MRI apparatus 500 that includes various components connected in various ways, it is to be appreciated that other MRI apparatus may include other components connected in other ways. In one example, to implement the example systems and methods described herein, MRI apparatus 500 may be configured with a robust GRAPPA logic 590. In different examples, robust GRAPPA logic 590 may be permanently and/or removably attached to an MRI apparatus. While robust GRAPPA logic 590 is illustrated as a single logic connected to control computer 570 and image computer 580, it is to be appreciated that parameter logic 590 may be distributed between and/or operably connected to other elements of apparatus 500. Robust GRAPPA logic 590 may execute portions of the methods described herein.

Thus, in one example, MRI apparatus 500 may have multiple coils and robust GRAPPA logic 590 may be operably connected to the MRI apparatus 500. The robust GRAPPA logic 590 is to be configured to perform a robust GRAPPA parallel MRI method. The method may include establishing an initial set of weights; calculating a set of coil coefficients using a set of linear equations that consider a set of ACS lines provided by the MRI apparatus; selectively manipulating members of the set of linear equations based on the set of coil coefficients; selectively manipulating members of the set of weights associated with outlying data points; and recalculating the set of coil coefficients based, at least in part, on the ACS lines and the linear equations.

In one example, logic 590 may be configured to perform an $RG_S$ method. In this example, calculating the set of coil coefficients includes performing a least-squares fit to solve the set of linear equations and manipulating a weight associated with an outlying data point includes setting a weight to a value that reduces the significance of the outlying data point. In the example $RG_S$ method, recalculating the set of coil coefficients includes iteratively performing a series of least-squares fits to solve the manipulated linear equations.

In another example, logic 590 may be configured to perform an $RG_F$ method. In this example, calculating the set of coil coefficients includes performing a least-squares fit to solve the set of linear equations and manipulating a weight associated with an outlying data point includes setting a weight to zero. In the $RG_F$ method, recalculating the set of coil coefficients includes performing a finite number of additional least-squares fit to solve the manipulated linear equations. For example, one additional least-squares fit may be performed.

Figure 6:
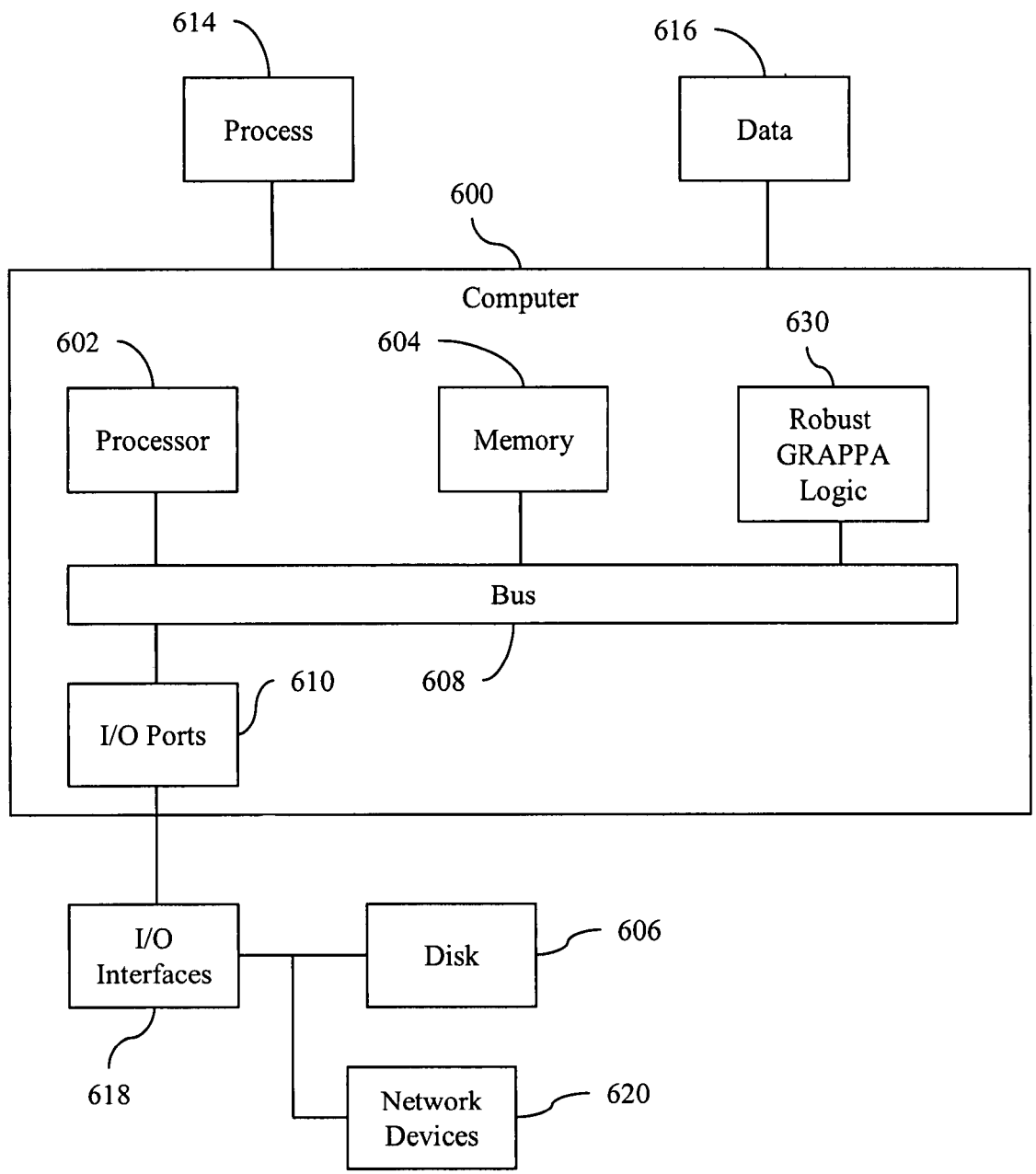
FIG. 6 illustrates an example computing environment in which example systems and methods illustrated herein may operate.

FIG. 6 illustrates an example computing device in which example systems and methods described herein, and equivalents, may operate. The example computing device may be a computer 600 that includes a processor 602, a memory 604, and input/output ports 610 operably connected by a bus 608. In one example, computer 600 may include a robust GRAPPA logic 630 configured to facilitate improved image reconstruction. In different examples, logic 630 may be implemented in hardware, software, firmware, and/or combinations thereof. Logic 630 may provide means (e.g., hardware, software, firmware) for acquiring a k-space data from an MR apparatus. The k-space data may include ACS lines and sub-sampled outer k-space data. Logic 630 may also provide means (e.g., hardware, software, firmware) for repetitively computing coil coefficients related to coil sensitivity associated with the MR apparatus. Logic 630 may also provide means (e.g., hardware, software, firmware) for manipulating weights associated with data points in the k-space data to selectively reduce the relevance of the data points. Logic 630 may also provide means (e.g., hardware, software, firmware) for determining missing k-space data using the k-space data and the coil coefficients.

Generally describing an example configuration of computer 600, processor 602 may be a variety of various processors including dual microprocessor and other multi-processor architectures. Memory 604 may include volatile memory and/or non-volatile memory. Non-volatile memory may include, for example, ROM, PROM, EPROM, and EEPROM. Volatile memory may include, for example, RAM, synchronous RAM (SRAM), dynamic RAM (DRAM), synchronous DRAM (SDRAM), double data rate SDRAM (DDR SDRAM), and direct RAM bus RAM (DRRAM).

Disk 606 may be operably connected to the computer 600 via, for example, an input/output interface (e.g., card, device) 618 and an input/output port 610. Disk 606 may be, for example, a magnetic disk drive, a solid state disk drive, a floppy disk drive, a tape drive, a Zip drive, a flash memory card, and/or a memory stick. Furthermore, disk 606 may be a CD-ROM, a CD recordable drive (CD-R drive), a CD rewriteable drive (CD-RW drive), and/or a digital video ROM drive (DVD ROM). Memory 604 can store processes 614 and/or data 616, for example. Disk 606 and/or memory 604 can store an operating system that controls and allocates resources of computer 600.

Bus 608 may be a single internal bus interconnect architecture and/or other bus or mesh architectures. While a single bus is illustrated, it is to be appreciated that computer 600 may communicate with various devices, logics, and peripherals using other busses (e.g., PCIE, SATA, Infiniband, 1394, USB, Ethernet). Bus 608 can be types including, for example, a memory bus, a memory controller, a peripheral bus, an external bus, a crossbar switch, and/or a local bus. The local bus may be, for example, an industrial standard architecture (ISA) bus, a microchannel architecture (MSA) bus, an extended ISA (EISA) bus, a peripheral component interconnect (PCI) bus, a universal serial (USB) bus, and a small computer systems interface (SCSI) bus.

Computer 600 may interact with input/output devices via i/o interfaces 61-8 and input/output ports 610. Input/output devices may be, for example, a keyboard, a microphone, a pointing and selection device, cameras, video cards, displays, disk 606, network devices 620, and so on. Input/output ports 610 may include, for example, serial ports, parallel ports, and USB ports.

Computer 600 can operate in a network environment and thus may be connected to network devices 620 via i/o interfaces 618, and/or i/o ports 610. Through the network devices 620, computer 600 may interact with a network. Through the network, computer 600 may be logically connected to remote computers. Networks with which computer 600 may interact include, but are not limited to, a local area network (LAN), a wide area network (WAN), and other networks. In different examples, network devices 620 may connect to LAN technologies including, for example, fiber distributed data interface (FDDI), copper distributed data interface (CDDI), Ethernet (IEEE 802.3), token ring (IEEE 802.5), wireless computer communication (IEEE 802.11), and Bluetooth (IEEE 802.15.1). Similarly, network devices 620 may connect to WAN technologies including, for example, point to point links, circuit switching networks (e.g., integrated services digital networks (ISDN), packet switching networks, and digital subscriber lines (DSL).

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer component", as used herein, refers to a computer-related entity (e.g., hardware, firmware, software, software in execution, combinations thereof). Computer components may include, for example, a process running on a processor, a processor, an object, an executable, a thread of execution, a program, and a computer. A computer component(s) may reside within a process and/or thread. A computer component may be localized on one computer and/or may be distributed between multiple computers.

"Computer communication", as used herein, refers to a communication between computing devices (e.g., computer, personal digital assistant, cellular telephone) and can be, for example, a network transfer, a file transfer, an applet transfer, an email, a hypertext transfer protocol (HTTP) transfer, and so on. A computer communication can occur across, for example, a wireless system (e.g., IEEE 802.11), an Ethernet system (e.g., IEEE 802.3), a token ring system (e.g., IEEE 802.5), a local area network (LAN), a wide area network (WAN), a point-to-point system, a circuit switching system, a packet switching system, and so on.

"Machine-readable medium", as used herein, refers to a medium that participates in directly or indirectly providing signals, instructions and/or data that can be read by a machine (e.g., computer). A machine-readable medium may take forms, including, but not limited to, non-volatile media (e.g., optical disk, magnetic disk), and volatile media (e.g., semiconductor memory, dynamic memory). Common forms of machine-readable mediums include floppy disks, hard disks, magnetic tapes, RAM (Random Access Memory), ROM (Read Only Memory), CD-ROM (Compact Disk ROM), and so on.

"Data store", as used herein, refers to a physical and/or logical entity that can store data. A data store may be, for example, a database, a table, a file, a list, a queue, a heap, a memory, a register, a disk, and so on. In different examples a data store may reside in one logical and/or physical entity and/or may be distributed between multiple logical and/or physical entities.

"Logic", as used herein, includes but is not limited to hardware, firmware, software and/or combinations thereof to perform a function(s) or an action(s), and/or to cause a function or action from another logic, method, and/or system. Logic may include a software controlled microprocessor, discrete logic (e.g., application specific integrated circuit (ASIC)), an analog circuit, a digital circuit, a programmed logic device, a memory device containing instructions, and so on. Logic may include a gate(s), a combinations of gates, other circuit components, and so on. Where multiple logical logics are described, it may be possible in some examples to incorporate the multiple logical logics into one physical logic. Similarly, where a single logical logic is described, it may be possible in some examples to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"Software", as used herein, includes but is not limited to, one or more computer instructions and/or processor instructions that can be read, interpreted, compiled, and/or executed by a computer and/or processor. Software causes a computer, processor, or other electronic device to perform functions, actions and/or behave in a desired manner. Software may be embodied in various forms including routines, algorithms, modules, methods, threads, and/or programs. In different examples software may be embodied in separate applications and/or code from dynamically linked libraries. In different examples, software may be implemented in executable and/or loadable forms including, but not limited to, a stand-alone program, an object, a function (local and/or remote), a servelet, an applet, instructions stored in a memory, part of an operating system, and so on. In different examples, computer-readable and/or executable instructions may be located in one logic and/or distributed between multiple communicating, co-operating, and/or parallel processing logics and thus may be loaded and/or executed in serial, parallel, massively parallel and other manners.

What is claimed is:

1. A method associated with magnetic resonance (MR), comprising:
    acquiring a k-space data from a magnetic resonance (MR) apparatus having two or more coils, the k-space data comprising a set of auto-calibration signal (ACS) lines, and a set of under sampled outer k-space data;
    creating a set of over determined linear equations to solve for coil coefficients associated with coil sensitivity associated with the two or more coils, the set of over determined linear equations depending, at least in part, on the set of ACS lines;
assigning a set of first weights to an ACS region;
calculating a set of coil coefficients based, at least in part, on the set of ACS lines;
selectively manipulating a weight of the first set of weights for an outlying data point to create a second set of weights;
selectively manipulating the set of over determined linear equations, in response to creating the second set of weights, based on the set of coil coefficients and one or more weights of the second set of weights to account for an outlying data point;
recalculating the set of coil coefficients based, at least in part, on the set of ACS lines and the set of over determined linear equations;
calculating a set of values for one or more missing k-space data points;
establishing a full k-space data set using the MR data and the set of values for the missing k-space data points; and
producing an image from the full k-space data set.

2. The method associated with MR of claim 1, the set of ACS lines being sampled at the Nyquist rate and the set of under sampled outer k-space data being sampled at a rate less than the Nyquist rate.

3. The method associated with MR of claim 1, the k-space data being acquired using one or more of, a Cartesian trajectory, a radial trajectory, a propeller trajectory, a blade trajectory, and a spiral trajectory.

4. The method associated with MR of claim 1, the k-space data being acquired from a dynamic MR imaging apparatus.

5. The method associated with MR of claim 1, where calculating the set of coil coefficients includes performing a least-squares fit to solve the set of over determined linear equations.

6. The method associated with MR of claim 5, where recalculating the set of coil coefficients includes performing one or more least-squares fits to solve the over determined equations after the over determined equations have been manipulated.

7. The method associated with MR of claim 6, including repetitively:
manipulating a weight of the first set of weights;
manipulating the set of over determined linear equations in response to manipulating the weight; and
recalculating the set of coil coefficients in response to manipulating the set of over determined linear equations,
until either a pre-determined number of iterations have occurred or a weight change stability threshold has been satisfied.

8. The method associated with MR of claim 6, where selectively manipulating at least one weight associated with an outlying data point includes setting a weight to a value that reduces the significance of the outlying data point.

9. The method associated with MR of claim 5, where recalculating the set of coil coefficients includes performing a single pass of a least squares fit.

10. The method associated with MR of claim 9, where selectively manipulating a weight associated with an outlying data point includes setting a weight to zero.

11. The method associated with MR of claim 1, where the number of outlying data points for which weights are to be manipulated is controlled by a best cut ratio.

12. The method associated with MR of claim 11, the best cut ratio being in the range 5% to 10%.

13. A method associated with magnetic resonance (MR), comprising:
establishing an initial set of weights for a set of data points;
calculating the set of coil coefficients using a set of over determined linear equations where the set of coil coefficients depend, at least in part, on a set of ACS lines in a k-space data acquired from an MRI apparatus;
selectively manipulating one or more members of the set of over determined linear equations based on the set of coil coefficients;
selectively manipulating one or more members of the initial set of weights associated with one or more outlying data points to create a second set of weights;
selectively manipulating the set of over determined linear equations, in response to creating the second set of weights, based on the set of coil coefficients and one or more weights of the second set of weights to account for the one or more outlying data points; and
recalculating the set of coil coefficients based, at least in part, on the set of ACS lines and the set of linear equations.

14. The method associated with MR of claim 13, where calculating the set of coil coefficients includes performing a least-squares fit to solve the set of over determined linear equations, where manipulating a weight associated with an outlying data point includes setting a weight to a value that reduces the significance of the outlying data point, and where recalculating the set of coil coefficients includes performing a series of least-squares fits to solve the manipulated over determined linear equations, the series continuing until either a pre-determined, configurable number of iterations have occurred, or a weight change stability threshold has been satisfied.

15. The method associated with MR of claim 14, where the value that reduces the significance of the outlying data point is one of, a real value less than 1.0, a negative value, and a complex value.

16. The method associated with MR of claim 13, where calculating the set of coil coefficients includes performing a least-squares fit to solve the set of over determined linear equations, where manipulating a weight associated with an outlying data point includes setting a weight to zero, and where recalculating the set of coil coefficients includes performing a second least-squares fit to solve the manipulated over determined linear equations.

17. A system associated with magnetic resonance (MR), comprising:
a magnetic resonance imaging (MRI) apparatus having two or more coils; and
a robust GRAPPA logic operably connected to the MRI apparatus, the robust GRAPPA logic being configured to perform a robust GRAPPA parallel MRI method, comprising:
establishing an initial set of weights with respect to a set of data points in a set of k-space data provided by the MRI apparatus;
calculating a set of coil coefficients that are utilized with the MRI apparatus using a set of over determined linear equations that consider a set of ACS lines provided by the MRI apparatus;
selectively manipulating one or more members of the set of over determined linear equations based on the set of coil coefficients;
selectively manipulating one or more members of the initial set of weights associated with one or more outlying data points in order to create a second set of weights;

selectively manipulating one or more members of the set of over determined linear equations, in response to creating the second set of weights, based on the set of coil coefficients and one or more weights of the second set of weights in order to account for the one or more outlying data points; and recalculating the set of coil coefficients based, at least in part, on the set of ACS lines and the set of linear equations.

18. The system associated with MR of claim 17, where calculating the set of coil coefficients includes performing a least-squares fit in order to solve the set of over determined linear equations, where manipulating a weight associated with an outlying data point includes setting a weight to a value that reduces the significance of the outlying data point, and where recalculating the set of coil coefficients includes performing a series of least-squares fits in order to solve the manipulated over determined linear equations.

19. The system associated with MR of claim 17, where calculating the set of coil coefficients includes performing a least-squares fit in order to solve the set of over determined linear equations, where manipulating a weight associated with an outlying data point includes setting a weight to zero, and where recalculating the set of coil coefficients includes performing a second least-squares fit in order to solve the manipulated over determined linear equations.

20. A system associated with magnetic resonance (MR), comprising:

means for acquiring a k-space data from an MR apparatus, where the k-space data includes one or more ACS lines and sub-sampled outer k-space data;

means for repetitively computing coil coefficients related to coil sensitivity associated with the MR apparatus;

means for manipulating a first set of weights associated with data points in the k-space data in order to selectively reduce the relevance of the data points and in order to create a second set of weights;

means for selectively manipulating a set of over determined linear equations, in response to creating the second set of weights, based on the coil coefficients and one or more weights of the second set of weights in order to account for the one or more outlying data points; and means for determining missing k-space data using the k-space data and the weighted coil coefficients.

* * * * *